United States Patent
Chien et al.

(10) Patent No.: US 10,269,966 B2
(45) Date of Patent: Apr. 23, 2019

(54) SEMICONDUCTOR DEVICE INCLUDING A FIN STRUCTURE

(71) Applicants: TAIWAN SEMICONDUCTOR MANUFACTURING CO., LTD., Hsinchu (TW); NATIONAL CHIAO TUNG UNIVERSITY, Hsinchu OT (TW)

(72) Inventors: Chao-Hsin Chien, Hsinchu (TW); Chi-Wen Liu, Hsinchu (TW); Chen-Han Chou, Hsinchu (TW)

(73) Assignees: TAIWAN SEMICONDUCTOR MANUFACTURING CO., LTD., Hsinchu (TW); NATIONAL CHIAO TUNG UNIVERSITY, Hsinchu (TW)

(*) Notice: Subject to any disclaimer, the term of this patent is extended or adjusted under 35 U.S.C. 154(b) by 0 days.

(21) Appl. No.: 15/807,317

(22) Filed: Nov. 8, 2017

(65) Prior Publication Data

US 2018/0069114 A1 Mar. 8, 2018

Related U.S. Application Data

(62) Division of application No. 15/214,777, filed on Jul. 20, 2016, now Pat. No. 9,837,538.

(60) Provisional application No. 62/313,682, filed on Mar. 25, 2016.

(51) Int. Cl.
| | | |
|---|---|---|
| H01L 29/78 | (2006.01) |
| H01L 29/165 | (2006.01) |
| H01L 29/66 | (2006.01) |
| H01L 29/10 | (2006.01) |

(52) U.S. Cl.
CPC ........ *H01L 29/785* (2013.01); *H01L 29/1054* (2013.01); *H01L 29/165* (2013.01); *H01L 29/66636* (2013.01); *H01L 29/66795* (2013.01); *H01L 29/7848* (2013.01)

(58) Field of Classification Search
CPC .............. H01L 29/785; H01L 29/7851; H01L 29/7848; H01L 29/7849; H01L 29/165; H01L 29/66636; H01L 29/66795
See application file for complete search history.

(56) References Cited

U.S. PATENT DOCUMENTS

| | | |
|---|---|---|
| 8,772,109 B2 | 7/2014 | Colinge |
| 9,202,920 B1 | 12/2015 | Liu et al. |
| 9,349,850 B2 * | 5/2016 | Colinge .............. H01L 29/7848 |

(Continued)

OTHER PUBLICATIONS

Notice of Allowance issued in related parent application U.S. Appl. No. 15/214,777 dated Jul. 31, 2017.

*Primary Examiner* — Scott B Geyer
(74) *Attorney, Agent, or Firm* — McDermott Will & Emery LLP

(57) ABSTRACT

A semiconductor device including a Fin FET device includes a fin structure extending in a first direction and protruding from a substrate layer. The fin structure includes a bulk stressor layer formed on the substrate layer and a channel layer disposed over the bulk stressor layer. An oxide layer is formed on the substrate layer extending away from the channel layer. A source-drain (SD) stressor structure is disposed on sidewalls of the channel layer over the oxide layer. A gate stack including a gate electrode layer and a gate dielectric layer covers a portion of the channel layer and extends in a second direction perpendicular to the first direction.

20 Claims, 16 Drawing Sheets

(56) References Cited

U.S. PATENT DOCUMENTS

| | | |
|---|---|---|
| 9,362,400 B1* | 6/2016 | Cheng ................ H01L 29/66545 |
| 2011/0147842 A1 | 6/2011 | Cappellani et al. |
| 2012/0224438 A1 | 9/2012 | Inaba |
| 2014/0077275 A1 | 3/2014 | Adam et al. |
| 2014/0231872 A1* | 8/2014 | Colinge ............ H01L 29/66795 |
| | | 257/192 |
| 2015/0249153 A1* | 9/2015 | Morin .................... H01L 29/785 |
| | | 257/192 |
| 2016/0005838 A1 | 1/2016 | Hung et al. |
| 2016/0035873 A1* | 2/2016 | Toh .................... H01L 29/66795 |
| | | 257/347 |
| 2016/0093739 A1* | 3/2016 | Jacob .................. H01L 29/7849 |
| | | 257/349 |
| 2016/0359043 A1* | 12/2016 | Chen .................... H01L 29/7851 |
| 2017/0062614 A1 | 3/2017 | Basker et al. |

* cited by examiner

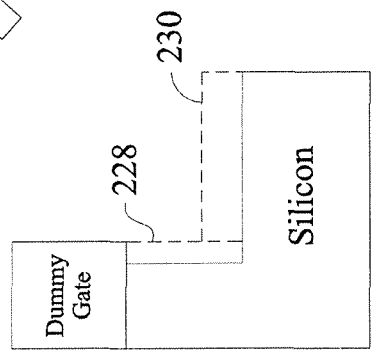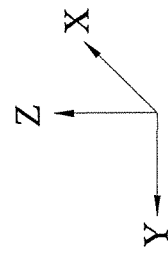
FIG. 3A
FIG. 3B
FIG. 3C

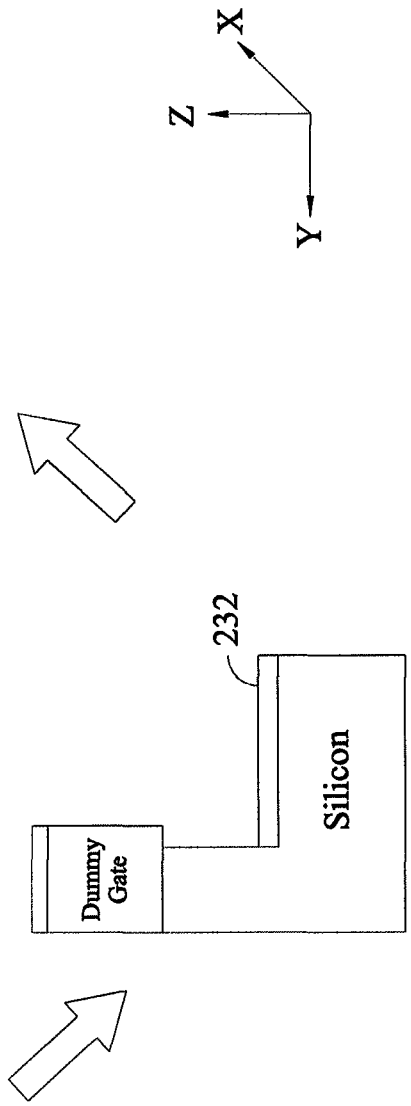
FIG. 3D
FIG. 3E
FIG. 3F

SEMICONDUCTOR DEVICE INCLUDING A FIN STRUCTURE

CROSS-REFERENCE TO RELATED APPLICATIONS

This application is a Divisional of U.S. patent application Ser. No. 15/214,777, filed on Jul. 20, 2016, which claims the benefit of priority under 35 U.S.C. § 119 from U.S. Provisional Patent Application 62/313,682, filed Mar. 25, 2016, which are incorporated herein by reference in their entireties.

TECHNICAL FIELD

The disclosure relates to a semiconductor integrated circuit, and more particularly to a semiconductor device having a contact-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field-effect transistors (Fin FETs). In a Fin FET, a gate electrode is adjacent to two side surfaces of a channel region with a gate dielectric layer interposed between them. On a top surface of the channel of a Fin FET, a passivation layer is formed between the gate electrode and the dielectric layer. In a tri-gate Fin FET (T-Fin FET), the additional passive layer is not formed and the gate structure surrounds (wraps) the fin on three surfaces and the transistor essentially has three gates controlling the current through the fin or channel region. Beyond 14 nm technology node, the epi source or drain structure introduces serious issues for fin pitch scaling. The source and/or drain sheet resistance and contact resistivity can play a critical role when the device area is scaling. Solutions are required that can efficiently resolve the resistance degradation by area shrinking.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A through 3F are exemplary process steps for the formation of a self-aligned oxide and a source-drain (S/D) epitaxial layer of a CAA T-Fin FET device according to one or more embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of".

Figure 1:
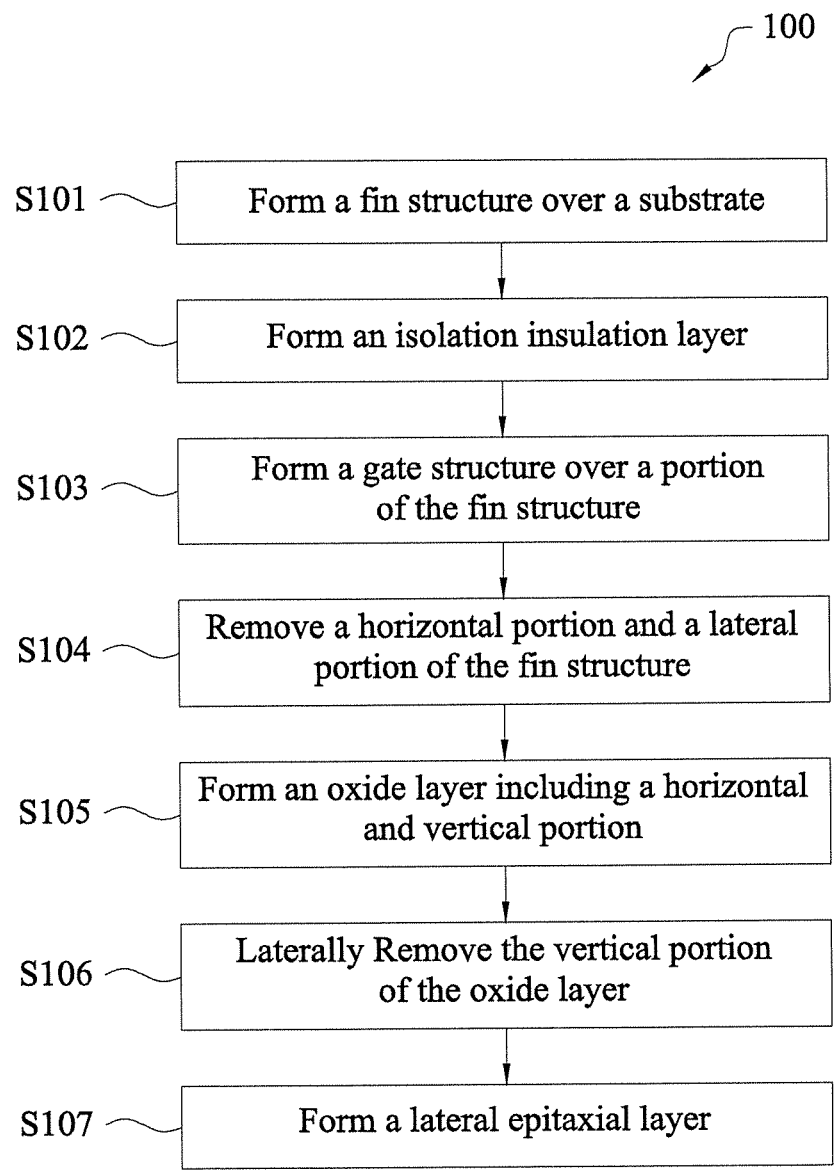
FIG. 1 is an exemplary process flow chart of a contact-all-around (CAA) T-Fin FET device according to one or more embodiments of the present disclosure.

FIG. 1 is an exemplary process flow chart 100 for manufacturing a contact-all-around (CAA) T-FinFET device according to one or more embodiments of the present disclosure. The flow chart 100 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2A:
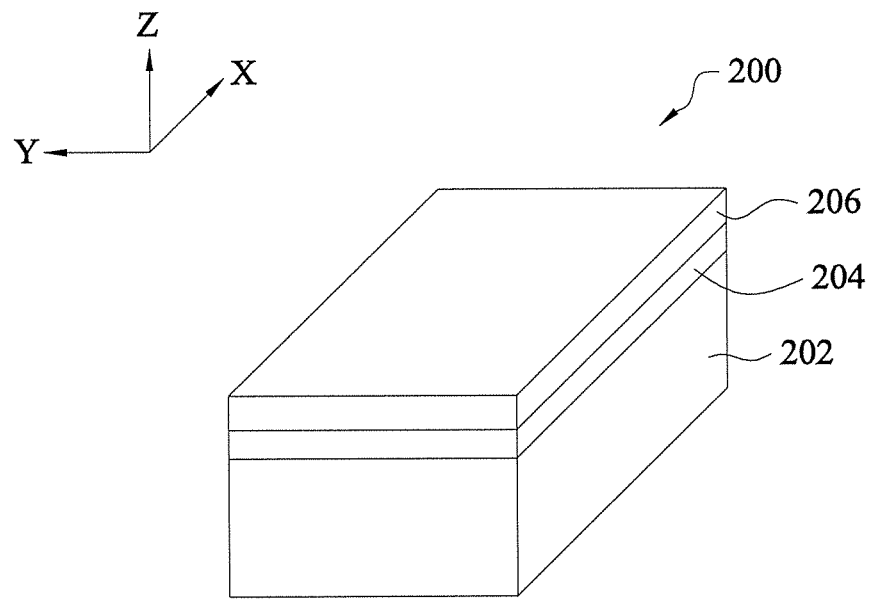
FIGS. 2A through 2H are exemplary three-dimensional (3-D) views showing various processes for manufacturing of a CAA T-Fin FET device according to one or more embodiments of the present disclosure.

In S101 of FIG. 1, a fin structure 210 is formed over a substrate. At first, stacked layers of semiconductor material 200 are formed over the substrate as shown in FIG. 2A. The stacked layers of the semiconductor material formed over the substrate include a first semiconductor layer 202, an intermediate semiconductor layer 204, and a second semiconductor layer 206.

The substrate, not shown separately from the first semiconductor layer 202, is for example, a p-type silicon substrate with an impurity concentration in a range of about $1 \times 10^{15}$ cm$^{-3}$ to about $3 \times 10^{15}$ cm$^{-3}$ in some embodiments. In other embodiments, the substrate is an n-type silicon substrate with an impurity concentration in a range of about $1 \times 10^{15}$ cm$^{-3}$ to about $3 \times 10^{15}$ cm$^{-3}$. The Si substrate has a (100) upper surface in some embodiments.

Alternatively, the substrate may comprise another elementary semiconductor, such as germanium; a compound semiconductor including Group IV-IV compound semiconductors such as silicon carbide (SiC) and silicon germanium (SiGe), Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate is a silicon layer of an SOI (silicon-on-insulator) substrate. Amorphous substrates, such as amorphous Si or amorphous SiC, or insulating material, such as silicon oxide may also be used as the substrate. The substrate may include various regions that have been suitably doped with impurities (e.g., p-type or n-type conductivity).

The first semiconductor layer 202 may be part of the substrate implanted with impurities. For instance, ion implantation is performed to prevent a punch-through effect. The dopants are, for example, boron (BF$_2$) for an n-type Fin FET and phosphorus for a p-type Fin FET. The first semiconductor layer 202 becomes a well layer of a Fin FET in some embodiments.

In some embodiments, the first semiconductor layer 202 is epitaxially grown over the substrate. The epitaxial layer 202 may be doped by in-situ doping and/or ion implantation.

The intermediate semiconductor layer 204, also known as the bulk stressor, is epitaxially grown over the surface of the first semiconductor layer 202, and a second semiconductor layer 206 is epitaxially grown over the intermediate semiconductor layer 204 in some embodiments.

The intermediate semiconductor layer 204 is, for example, Ge or $Si_{(1-x)}Ge_x$, where x is in a range of about 0.1 to about 0.9 in some embodiments. In a certain embodiment, $Si_{(1-x)}Ge_x$ is used as the intermediate semiconductor layer 204. In the present disclosure, $Si_{(1-x)}Ge_x$ may be simply referred to as SiGe. A thickness of the SiGe layer 204 is in a range of about 10 nm to about 100 nm in some embodiments. In certain embodiments, the thickness of the SiGe layer 204 is in a range of about 1 nm to about 20 nm, or in a range of about 2 nm to about 10 nm in other embodiments.

The epitaxial growth of the SiGe layer may be performed by using SiH$_4$ and/or SiH$_2$Cl$_2$ and GeH$_4$ as source gases at a temperature in a range of about 500° C. to about 700° C. and at a pressure in a range of about 10 to about 100 Torr (about 133 Pa to about 1333 Pa).

The second semiconductor layer 206 is, for example, Si or $Si_{(1-y)}Ge_y$, where y<x. The second semiconductor layer 206 is Si in this embodiment. The Si second semiconductor layer 206 has a thickness in a range of about 20 nm to about 200 nm in some embodiments. In certain embodiments, the thickness of the Si second semiconductor layer 206 is in a range of about 50 nm to about 100 nm. The epitaxial growth of the Si layer may be performed by using SiH$_4$ and/or SiH$_2$Cl$_2$ as source gases at a temperature in a range of about 500° C. to 700° C. and at a pressure in a range of about 10 to about 100 Torr (about 133 Pa to about 1333 Pa).

Figure 2B:
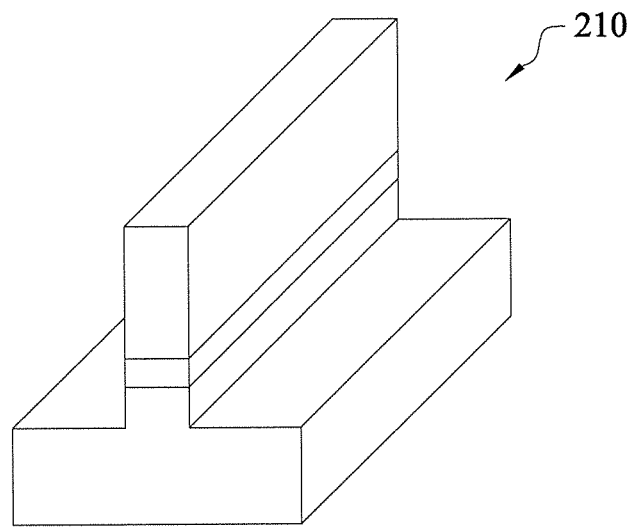

After formation, the stacked layers of the semiconductor material 200 are patterned using suitable mask layers to remove portions of the stacked layers to create the fin structure 210 of FIG. 2B. The removal of the portions of the stacked layers can be performed by trench etching using a dry etching method and/or a wet etching method.

Figure 2C:
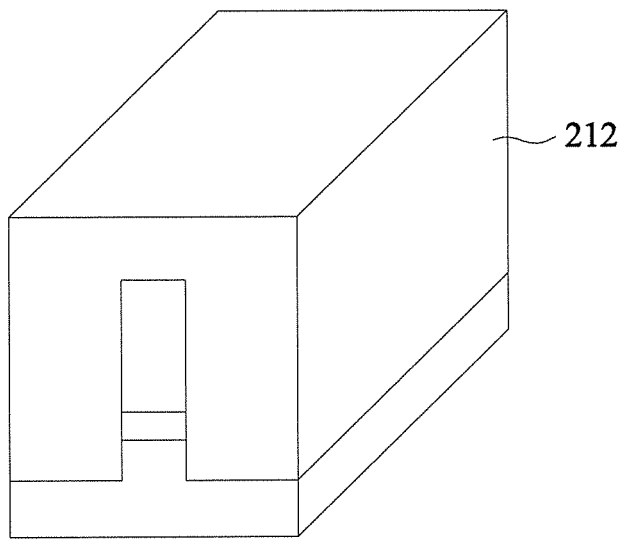
Figure 2D:
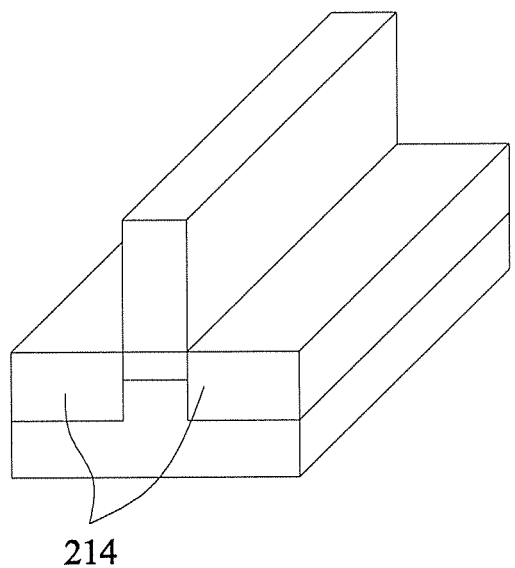

In S102 of FIG. 1, an isolation insulation layer 214 is formed over the fin structure 210, as shown in FIGS. 2C and 2D. First, an isolation insulating material 212 is formed on the fin structure 210 as shown in FIG. 2C. The isolation insulating material 212 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densities and shrinks. In some embodiments, multiple anneal processes are conducted. The flowable film is cured and annealed more than once. The flowable film may be doped with boron and/or phosphorous. The isolation insulating layer 50 is formed by one or more layers of spin-on glass (SOG), SiO, SiON, SiOCN and/or fluorine-doped silicate glass (FSG) in some embodiments.

After forming the isolation insulating material 212, a thermal process, for example, an anneal process, may be performed to improve the quality of the isolation insulating material 212. The thermal process may be performed before or after planarization operations. In the planarization operations, the thickness of the isolation insulating material 212 is reduced by, for example, a planarization process including a chemical mechanical polishing (CMP) method and/or an etch-back process, so as to expose a part of the fin structures 210, as shown in FIG. 2D. During the planarization operations, a top portion of the isolation insulating material 212 is removed. Further, by an etch-back process, the thickness of the isolation insulating material 212 on the sides of the protruded portion of the fin structure 210 is reduced to form the isolation insulating layer 214.

Figure 2E:
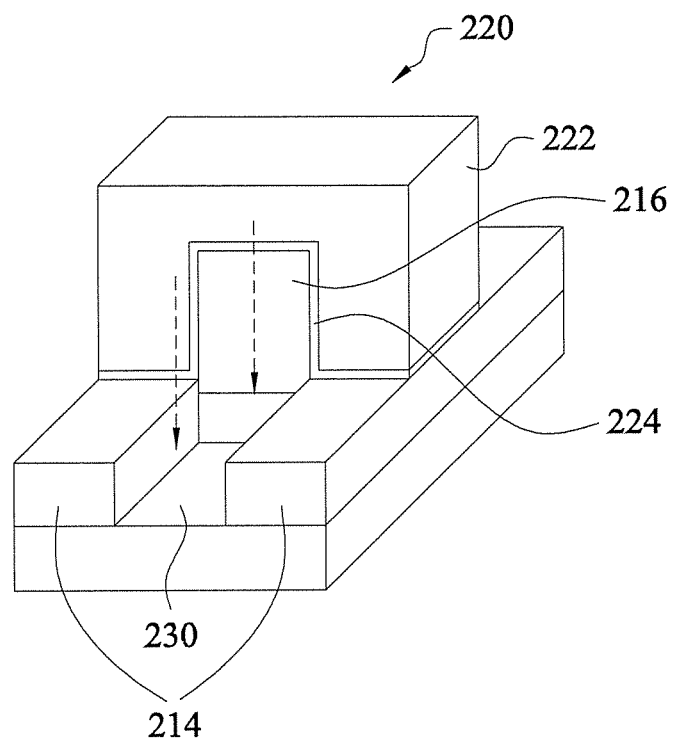

In S103 of FIG. 1, a gate structure 220 is formed over a portion of the fin structure 210, as shown in FIG. 2E. The gate structure 220 is formed over a channel layer 216 of the fin structure 210. The gate structure 220 extends in the Y direction and includes a gate dielectric layer 224 and an electrode layer 222. In some embodiments, the gate structure 220 is formed over one or more fin structures.

A gate dielectric material and an electrode material are formed over the isolation insulating layer 214 and the channel layer 216, and then patterning operations are performed so as to obtain gate structure 220 including the gate electrode layer 222 and the gate dielectric layer 224. The gate electrode layer 222 is poly silicon in this embodiment. The patterning of the poly silicon layer is performed by using a hard mask including a silicon nitride layer and an oxide layer in some embodiments. The gate dielectric material may be silicon oxide formed by CVD, PVD, ALD (atomic layer deposition), e-beam evaporation, or other suitable process.

In one or more embodiments, a gate-last technology (a gate replacement technology) is employed. In the gate-last technology, the gate electrode layer 222 and the gate dielectric layer 224 formed in the foregoing operations are a dummy electrode layer and a dummy gate dielectric layer, respectively, which are subsequently removed.

In some embodiments, the gate dielectric layer 224 includes one or more layers of silicon oxide, silicon nitride, silicon oxy-nitride, or high-k dielectric materials. High-k dielectric materials comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer 224 is in the range of about 1 nm to about 5 nm. In some embodiments, the gate dielectric layer 224 includes an interfacial layer made of silicon dioxide. In some embodiments, the gate electrode layer 222 includes a single layer or a multilayer structure.

Further, the gate electrode layer 222 may be doped poly-silicon with uniform or non-uniform doping. In some alternative embodiments, the gate electrode layer 222 includes a metal such as Al, Cu, W, Ti, Ta, TiN, TiAl, TiAlN, TaN, NiSi, CoSi, other conductive materials with a work function compatible with the substrate material, or combinations thereof. The electrode layer for the gate electrode layer 222 may be formed using a suitable process such as ALD, CVD, PVD, plating, or combinations thereof. The width of the gate electrode layer 222 (in the X direction) is in the range of about 30 nm to about 60 nm in some embodiments.

In S104 of FIG. 1, a horizontal portion and a lateral portion of the fin structure are removed as shown in FIG. 2E. A more detailed description of the removal process is shown in the cross-sectional views of FIGS. 3A and 3B. Removal of the horizontal (e.g., in the XY plane) portion 230 and the vertical (e.g., in the Z direction) portion 228 under the gate structure 220 of FIG. 3A is performed by an isotropic etch, for example, a wet etch process. In one or more embodiments, the thickness t1 of the portion 228 is about 10-12 nm. In some embodiments, a plasma etch such as an oxygen ($O_2$) plasma can be used. In an embodiment, the $O_2$ plasma etch can be an $O_2$ plasma ion etch using, for example, charged $O^{2-}$ or $O^{1-}$ with an added bias connected to a bias electrode 302 to control the direction of the ionized $O_2$ plasma.

Figure 2F:
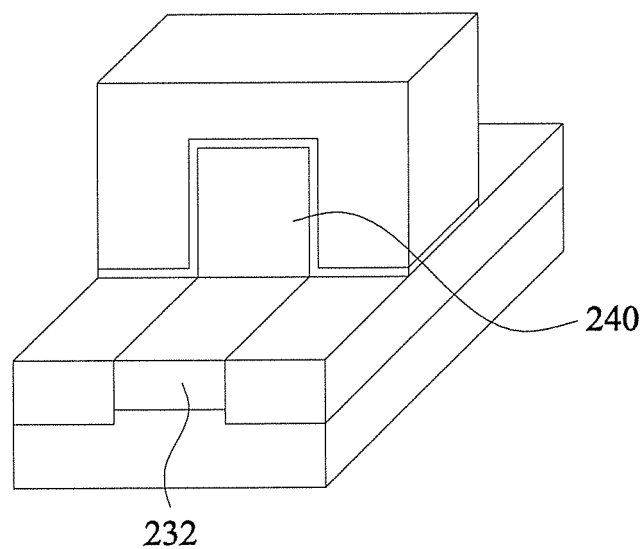

In S105 of FIG. 1 an oxide layer including a horizontal portion 232 and a vertical portion 310 is formed as shown in FIGS. 2F and 3C. FIG. 2F only shows the horizontal portion 232 of the oxide layer. The oxide layer includes a silicon oxide, such as $SiO_2$. In an embodiment, the horizontal portion 232 of the oxide layer, also referred to as the self-aligned oxide layer, is formed using a high density plasma CVD (HD PCVD) and the vertical portion 310 is an unwanted layer resulting from the deposition process which has to be removed. In the self-aligned deposition process, no mask is required and the silicon oxide is deposited on all exposed surfaces as seen in FIG. 3C. In some embodiments, isotropic etching is used to remove sidewalls isolation layer. In one embodiment, the unwanted silicon oxide deposition is selectively removed from some surfaces that were not the target for oxide layer deposition, as necessary, although the use of selective etching may not be efficient for this structure.

FIG. 3D is the same as FIG. 3C and shows the horizontal portion 232 and the vertical portion 310 and is reproduced for convenience only. In some embodiments, high-density PCVD (HDPCVD) is used to allow adjustment of different deposition rates along various directions. For example, the HDPCVD can be used to achieve a nearly anisotropic deposition by adjusting the physical factors of the operation (e.g., plasma controlled by electrical field), rather than the chemical factors of the operation (e.g., reactant gas) that is used for near isotropic deposition. In some embodiments, the thickness of the isolation layers 310 on the sidewalls is about 25 percent to about 35 percent the thickness of the isolation layers 232 on the surface of the substrate 400. Consequently, a cleaning process (e.g., a wet clean process) comprising the use of an etchant, such as hydrofluoric acid (HF) or diluted hydrofluoric acid (DHF), may be effective in removing the entirety of or only portions of the isolation layers 310 disposed on the sidewalls, while leaving the portions of the isolation layers 232 on the surfaces of the substrate 400.

In S106 of FIG. 1, the vertical portion 310 is laterally removed as shown in FIG. 3E. The vertical portion 310 of the oxide layer can be laterally removed by using, for example, a wet etch process that also reduces the thickness of the horizontal portion 232 to the desired level, for example, between 5-10 nm.

In S107 of FIG. 1 a lateral epitaxial layer 240 is formed, as shown in FIGS. 2F and 3F. The lateral epitaxial layer 240 can be formed by a selective epitaxial growth process. The lateral epitaxial layer 240 is also referred to as source and/or drain epitaxial layer or source and/or drain stressor. The source and/or drain epitaxial layer can be a silicon-based compound such as silicon phosphide or SiGe. In some exemplary embodiments, the source and/or drain epitaxial layer is a germanium compound, such a germanium-tin compound (GeSn). A thickness t2 of the source and/or drain epitaxial layer 240 is in a range of about 10-12 nm. In certain embodiments, other thicknesses are used.

Figure 2G:
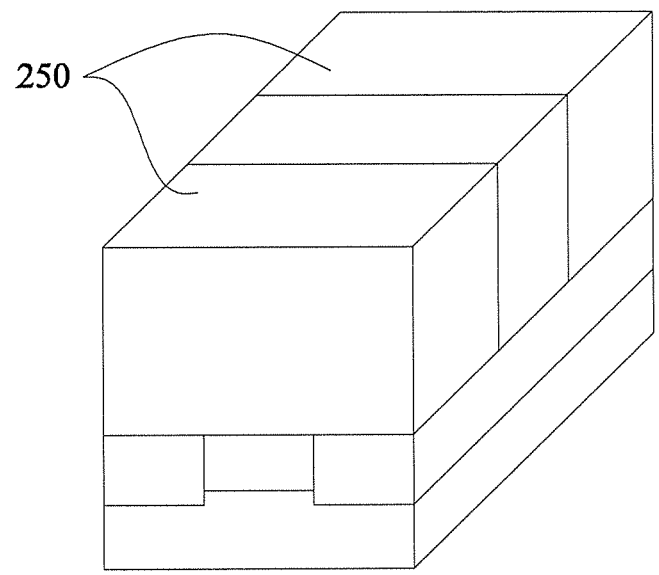

Returning to FIG. 2G in continuation of the formation of the CAA T-FinFET device, a interlayer dielectric (ILD) layer 250 is formed over the isolation oxide layer 214 and the self-aligned oxide layer 232. Example materials for the ILD layer 250 include silicon dioxide ($SiO_2$), silicon oxynitride (SiON), or silicon oxycarbide (SiOC). The structure of FIG. 2G is then passed to a planarization operation such CMP and gate contact formation.

Figure 2H:
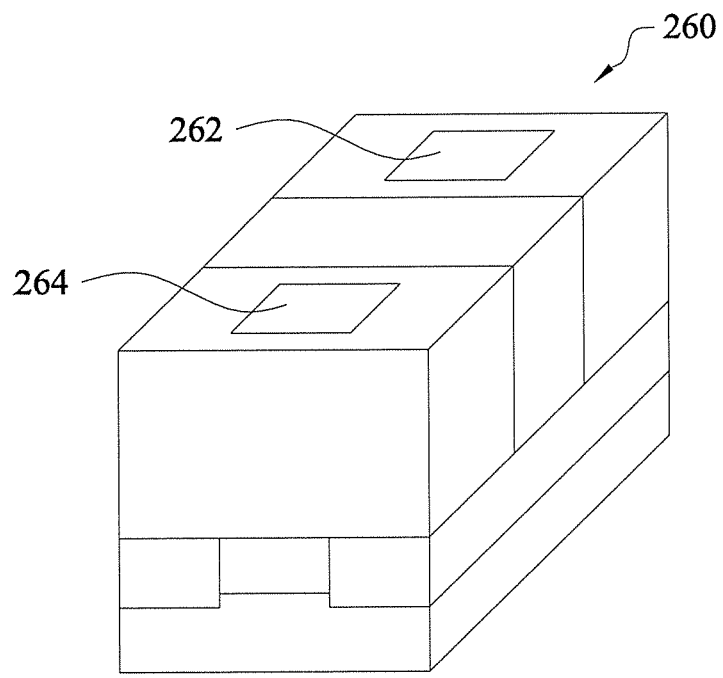

The ILD layer 250 is patterned to remove portions of the interlayer dielectric layer 250 down to the self-aligned oxide layer 214 to form holes for source and drain contacts 262 and 264 of a CAA T-FinFET device 260 as shown in FIG. 2H. The holes are filled with source and drain contact materials, such as metals including Al, Cu, W, Ti, Ta, TiN, TiAl, TiAlN, TaN, NiSi, CoSi, other conductive materials with a suitable work function, or combinations thereof. In the context of the present disclosure, the CAA refers to the source and/or drain contact metal replacing the diamond-shape source and/or drain stressor structure instead of the source and/or drain contact metal wrapping around diamond-shaped source and/or drain stressor structure. The process concept described above can be integrated into present Fin FET fabrication process, and can be implemented in a number of technology nodes, such as 10, 7, and 5 nm technology nodes.

Figure 4A:
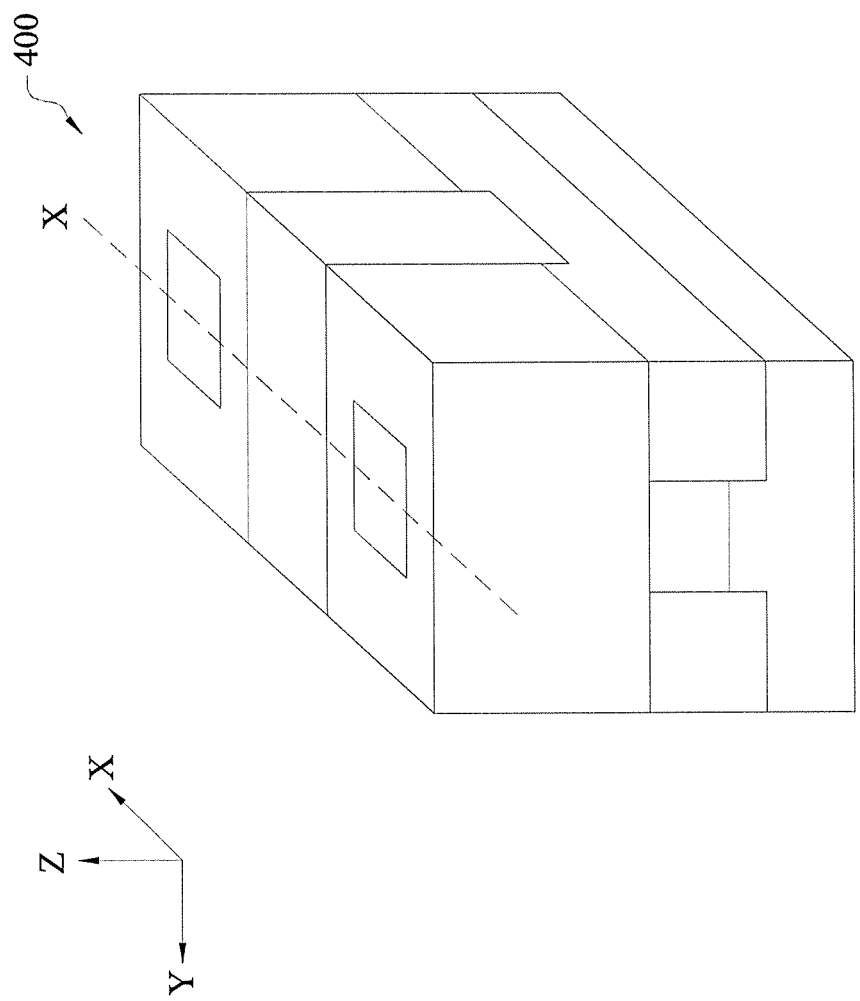
FIGS. 4A and 4B are exemplary 3-D structural and cross-sectional views of a CAA T-Fin FET device according to one or more embodiments of the present disclosure.
Figure 4B:
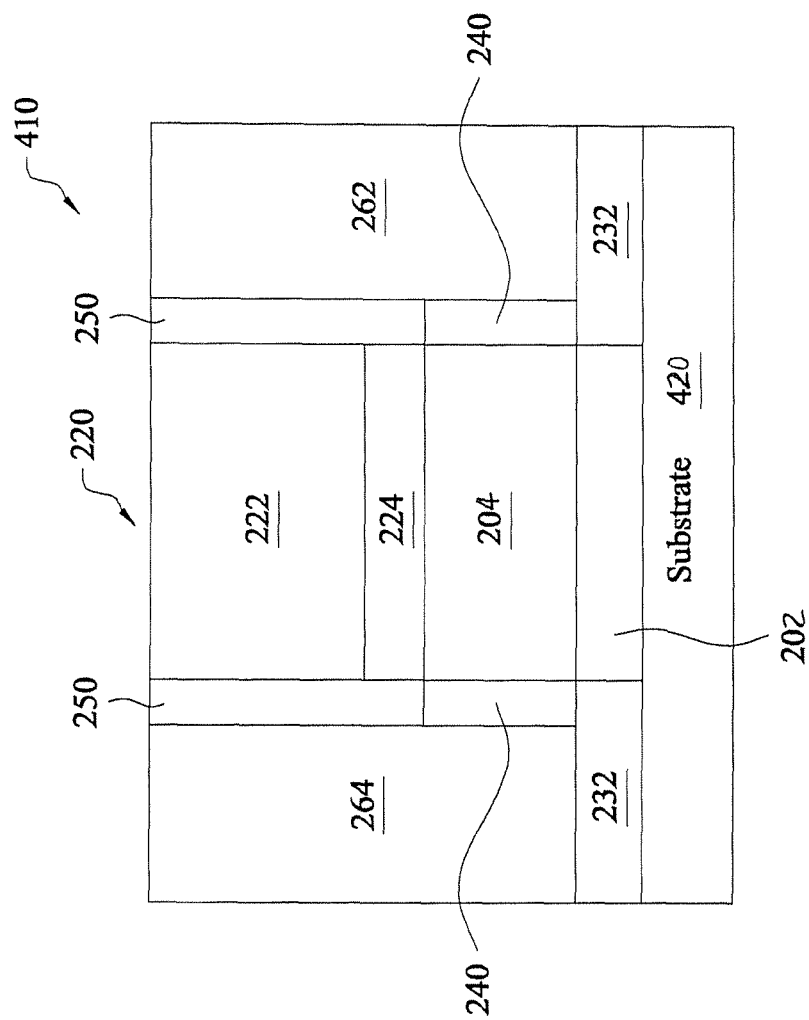

FIGS. 4A and 4B are exemplary 3-D structural 400 and cross-sectional views 410 of a CAA T-Fin FET device according to one or more embodiments of the present disclosure. The 3-D structure 400 of FIG. 4A, of which a cross section across the line X is shown in FIG. 4B, is similar to the structure of FIG. 2H. As shown in the cross-sectional view 410, the CAA T-Fin FET device includes substrate 420, bulk stressor layer 204, self-aligned oxide layer 232, SD epitaxial layer 240, first semiconductor layer 202, gate structure 220, ILD layer 250, and source and/or drain contact metals 262 and 264. As explained above, the first semiconductor layer may be part of the substrate 420 implanted with impurities. The gate structure 220 includes the gate dielectric layer 224 and the gate electrode 222.

The SD epitaxial layer 240 may have an aspect ratio (z/x) corresponding to the cross-sectional view 410 (e.g., in Z-X plane) of more than one. In some embodiments, the aspect ratio of the SD epitaxial layer 240 is less than one. In one or more embodiments, the self-aligned oxide layer 232 extends in the Y direction partially or fully under the SD epitaxial layer 240. In some embodiments, SD epitaxial layer 240 extends in the Z direction above or below the height of the first semiconductor layer 202. In one or more embodiments, the thickness of the SD epitaxial layer 240 in the Y direction is less than or more than the thickness of the ILD layer 250 in the Y direction.

The self-aligned oxide layer 232 under source and/or drain contact metals 262 and 264 replaces the exemplary diamond-shape epitaxial S/D. The replacement improves the source and/or drain resistance and mitigates short channel issues and lowers source and/or drain junction leakage, for example, to $1\times10^{-10}$ A. For the exemplary diamond-shape epitaxial S/D, the source and/or drain size is dependent on the shape of the epitaxial diamond-shape, which also reduces fin pitch scaling. Further, from an engineering standpoint, the source and/or drain resistance increases as the device area is reduced. The subject technology provides reduced fin pitch, for example, lower than 40 nm for a 15 nm technology node, resulting in a high integration density. The subject technology improves the source and/or drain resistance to achieve higher device performance by reducing leakage current from the source and/or drain contact metals.

Figure 5A:
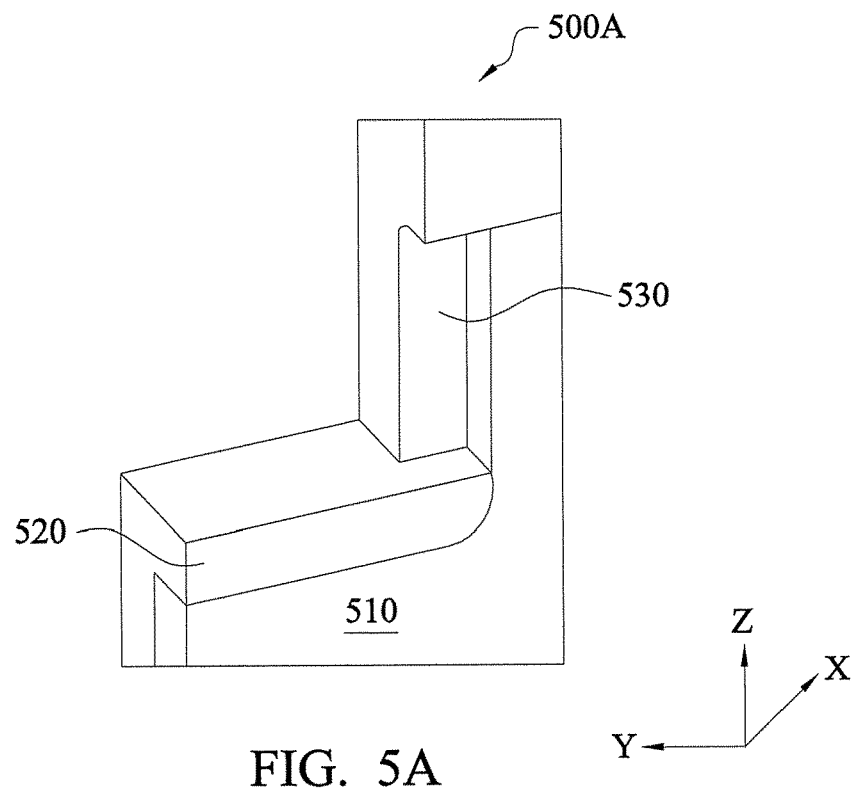
FIGS. 5A through 5D are 3-D views showing the formation of a lateral epitaxial layer and source and/or drain contacts of a CAA T-Fin FET device according to an embodiment of the present disclosure.
Figure 5B:
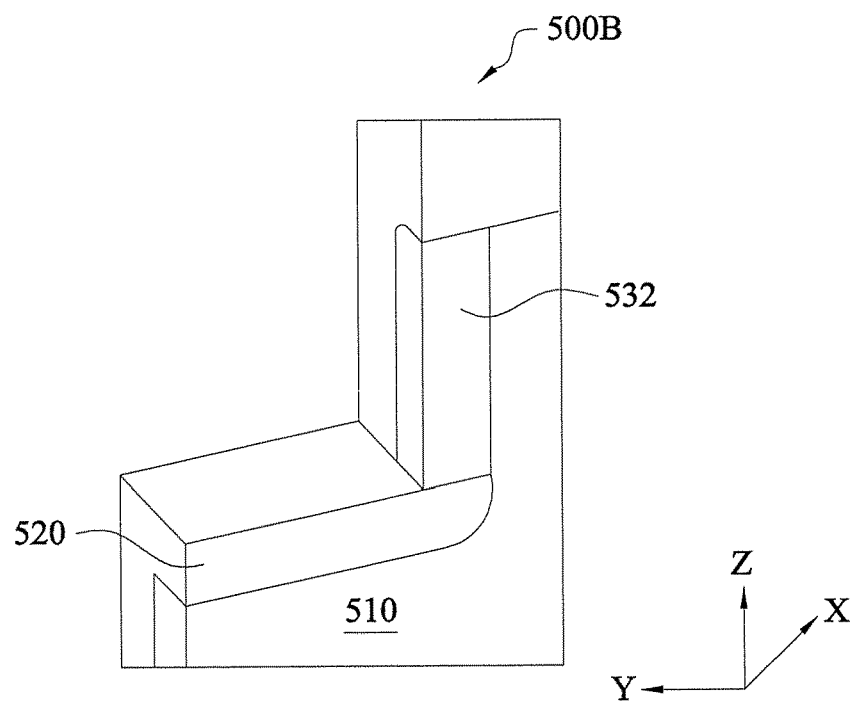
Figure 5C:
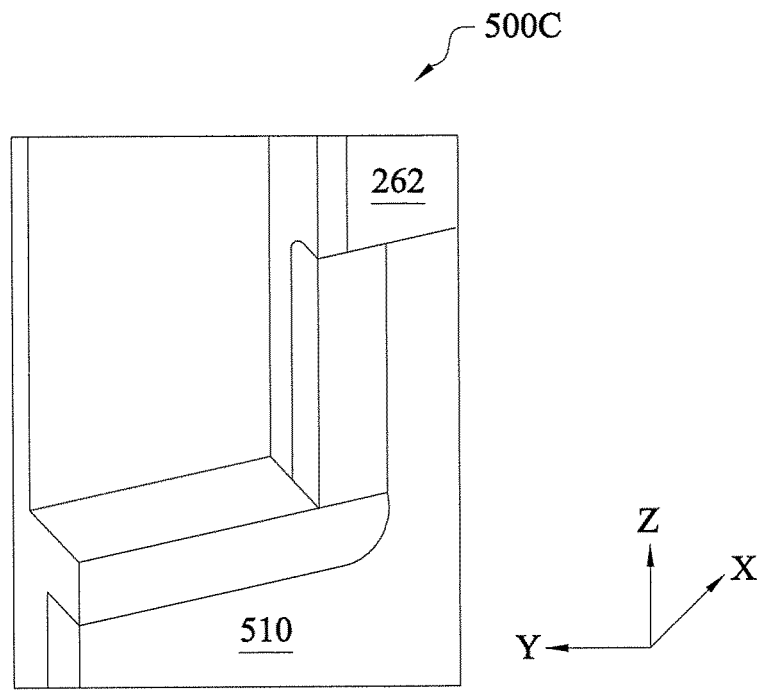
Figure 5D:
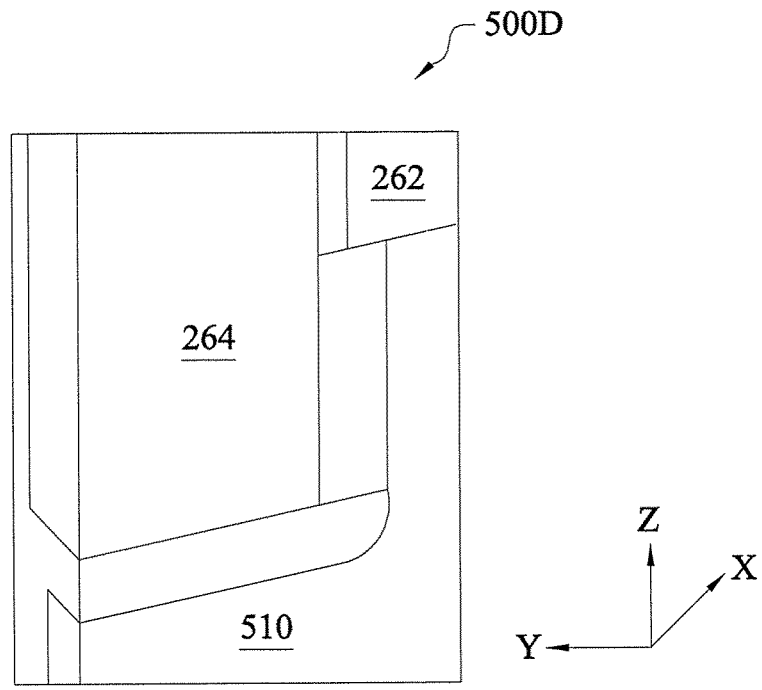

FIGS. 5A through 5D are 3-D views showing the formation of a lateral epitaxial layer and source and/or drain contacts of a CAA T-Fin FET device according to an embodiment of the present disclosure. FIG. 5A shows a CAA T-Fin FET structure 500A including an oxide layer 520 over the first semiconductor layer 510 and an opening 530 laterally etched for source and/or drain epitaxial formation. FIG. 5B shows a CAA T-Fin FET structure 500B, where the source and/or drain epitaxial formation 532 is formed in the opening 530 of FIG. 5A. In the next step, as shown in the CAA T-Fin FET structure 500C in FIG. 5C, one of source and/or drain contact metals, 262, is formed. In the last step, as shown in the CAA T-Fin FET structure 500D in FIG. 5D, the other one of source and/or drain contact metals, 264, is formed. The source and/or drain contact metals in FIGS. 5C and 5D are similar to the source and/or drain contact metals used with the exemplary diamond-shape epitaxial S/D.

Figure 6:
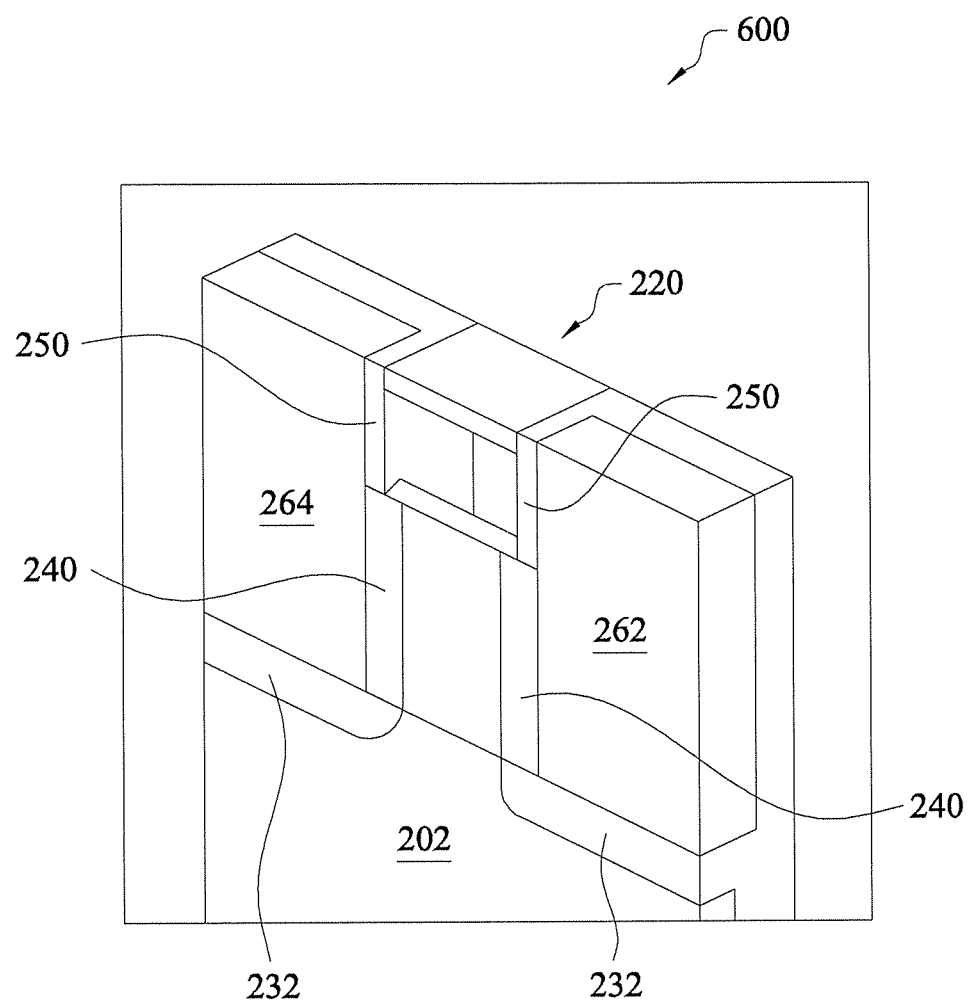
FIG. 6 is a three-dimensional view of CAA T-Fin FET device showing various structural elements according to an embodiment of the present disclosure.
Figure 7A:
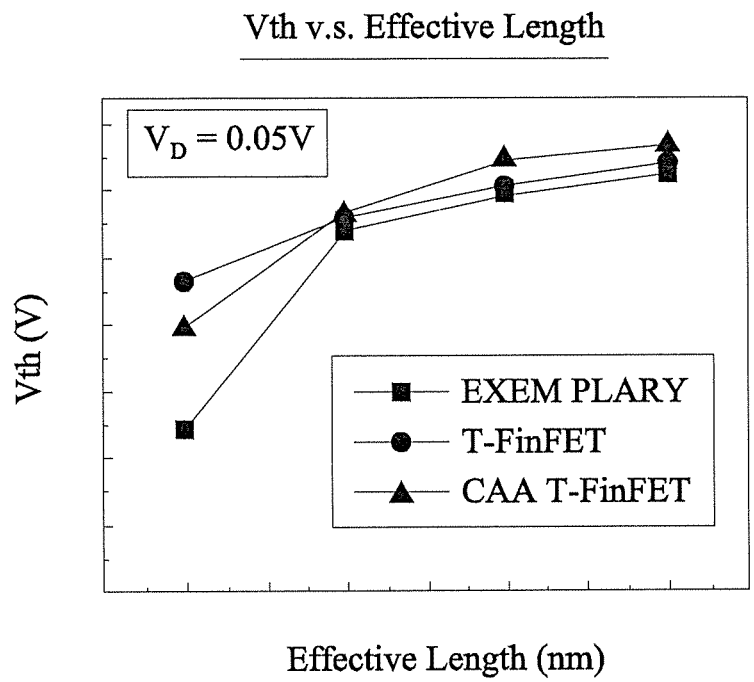
FIGS. 7A through 7D are diagrams showing various parameters of a CAA T-Fin FET device versus effective channel length according to embodiments of the present disclosure.
Figure 7B:
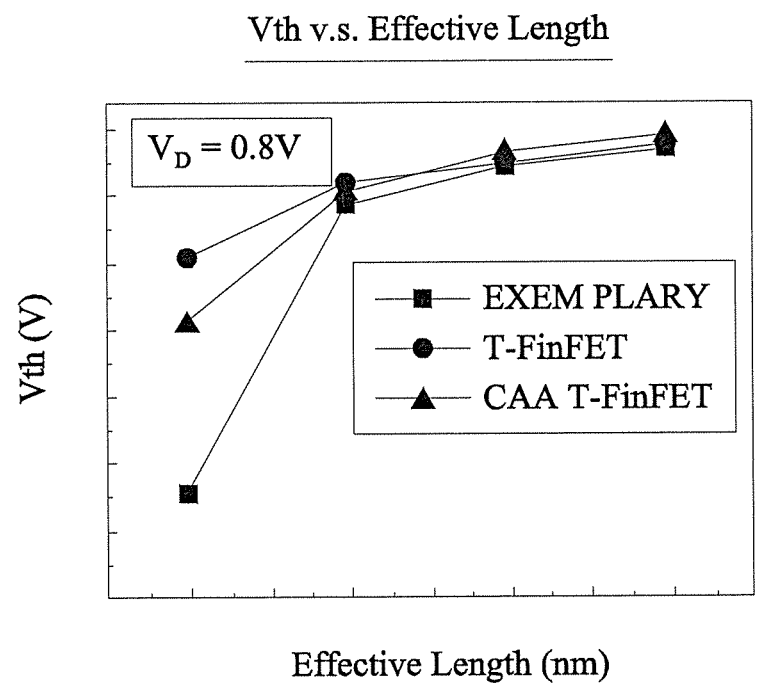
Figure 7C:
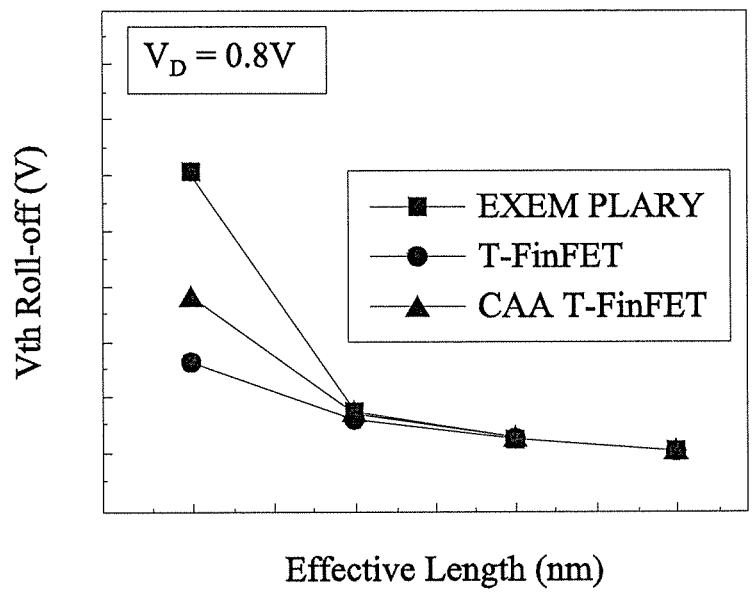
Figure 7D:
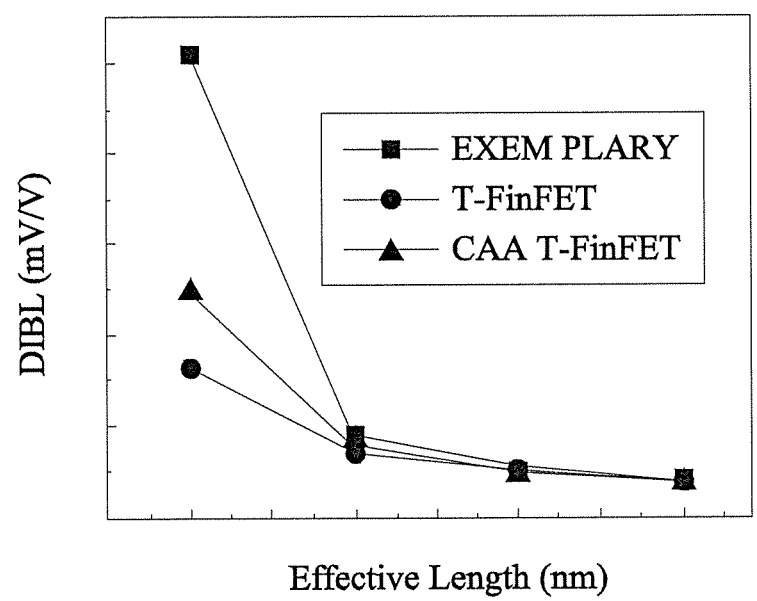

FIG. 6 is a three-dimensional view of CAA T-Fin FET device 600 showing various structural elements according to an embodiment of the present disclosure. The structural elements are similar to the structural elements shown in the cross-sectional view 410 of FIG. 4B. The CAA Fin FET device 600 includes the first semiconductor layer 202, self-aligned oxide layer 232 formed between the first semiconductor layer 202 and the source and/or drain contact metals 262 and 264, source and/or drain epitaxial layer 240 formed laterally between the channel portion of the semiconductor layer 202 and the source and/or drain contact metals 262 and 264, the ILD layer 250, and the gate structure 220 formed over the channel.

As described above in more detail, the gate structure 220 is first created on a portion of the exposed fin 210 after formation of the isolation insulation layer 214, as shown in FIG. 2E. Next, as shown in FIGS. 3A and 3B, the horizontal (e.g., in the XY plane) portion 230 and the vertical (e.g., in the Z direction) portion 228 under the gate structure 220 are removed by an etch process, such as a wet etch, or a plasma etch, such as an oxygen ($O_2$) plasma. In one or more embodiments, the $O_2$ plasma etch is an $O_2$ plasma ion etch using, for example, charged $O^{2-}$ or $O^{1-}$ to control the direction of the ionized $O_2$ plasma. After removal of the horizontal portion 230 and the vertical portion 228 of FIGS. 3A ands. 3A and B, the self-aligned oxide layer 232 is formed using, for example, a CVD deposition process such as the HD PCVD process to deposit silicon oxide. The self-aligned oxide formation process results in deposition of the silicon oxide (310 of FIG. 3C) on the sidewalls of the channel, as shown in FIG. 3C. The removal of the silicon oxide 310 creates a place under the gate structure 220 and over the oxide layer 232 for formation of the epitaxial layer 240. The lateral epitaxial layer 240 can be formed by a selective epitaxial growth process. The lateral epitaxial layer 240, also referred to as source and/or drain epitaxial layer or source and/or drain stressor, can be a silicon-based compound such as silicon phosphide or SiGe. In some exemplary embodiments, the source and/or drain epitaxial layer is a germanium compound, such as a germanium-tin compound (GeSn). A thickness of source and/or drain epitaxial layer is in a range of about 10-12 nm. The source and/or drain contact metals 262 and 264 are formed, as shown in FIG. 2H, after etching holes in the ILD layer 250 down to the top surface of the self-aligned oxide 232.

FIGS. 7A through 7D are diagrams showing various parameters of a CAA T-Fin FET device versus effective channel length according to embodiments of the present disclosure. The diagrams shown in FIGS. 7A and 7C include plots for an exemplary Fin FET, a T-Fin FET, and a CAA T-Fin FET showing the variation of the Fin FET threshold voltage (Vth) versus effective length of the channel for example values of drain voltage (VD), VD=0.05V and VD=0.8V. The diagram shown in FIG. 7B includes plots for the exemplary Fin FET, the T-Fin FET, and the CAA T-Fin FET showing the variation of the Fin FET Vth roll-off versus effective length of the channel for an example value of drain voltage, VD=0.8V. The diagram shown in FIG. 7D includes plots for the exemplary Fin FET, the T-Fin FET, and the CAA T-Fin FET showing the variation of the Fin FET DIBL (drain-induced barrier lowering) versus effective length of the channel. Analyzing the results indicates that the CAA T-Fin FET achieves an improvement in Vth roll-off over the Fin FET, which includes the self-aligned oxide but lacks the source and/or drain epitaxial. Further, in the CAA T-Fin FET the diamond-shape source and/or drain stressor is replaced by a full contact metal that benefits the fin pitch scaling.

Figure 8A:
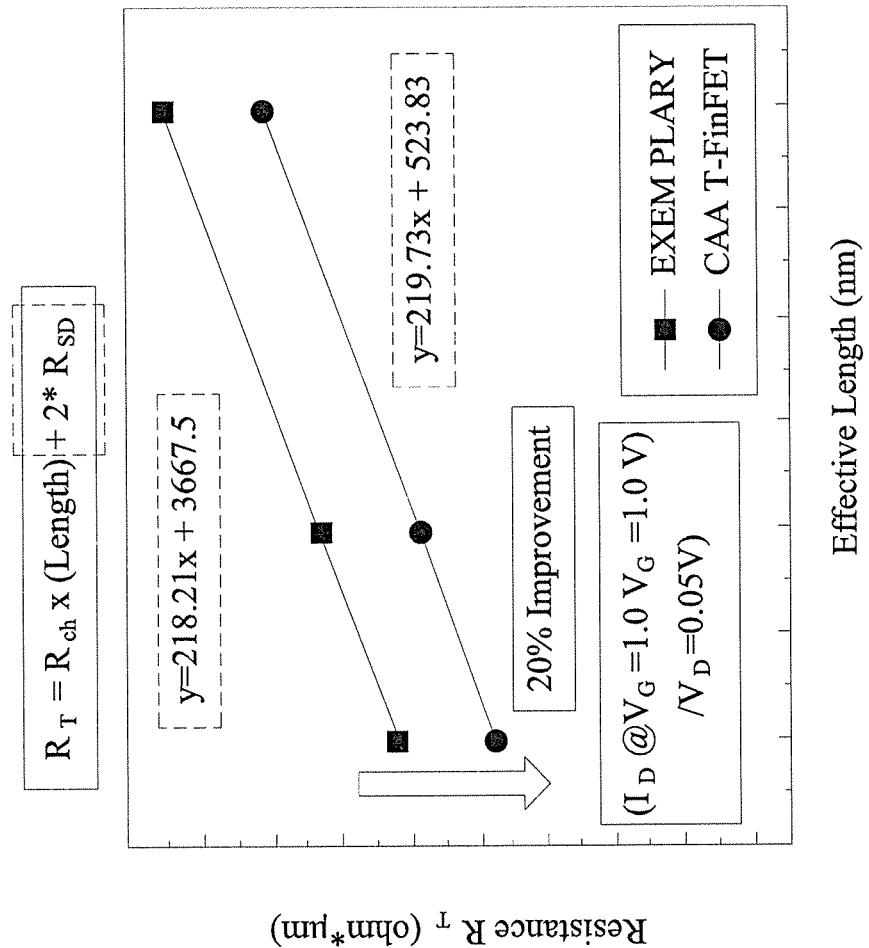
FIGS. 8A and 8B are diagrams showing the results of a 3-D simulation of a CAA T-Fin FET device according to an embodiment of the present disclosure.
Figure 8B:
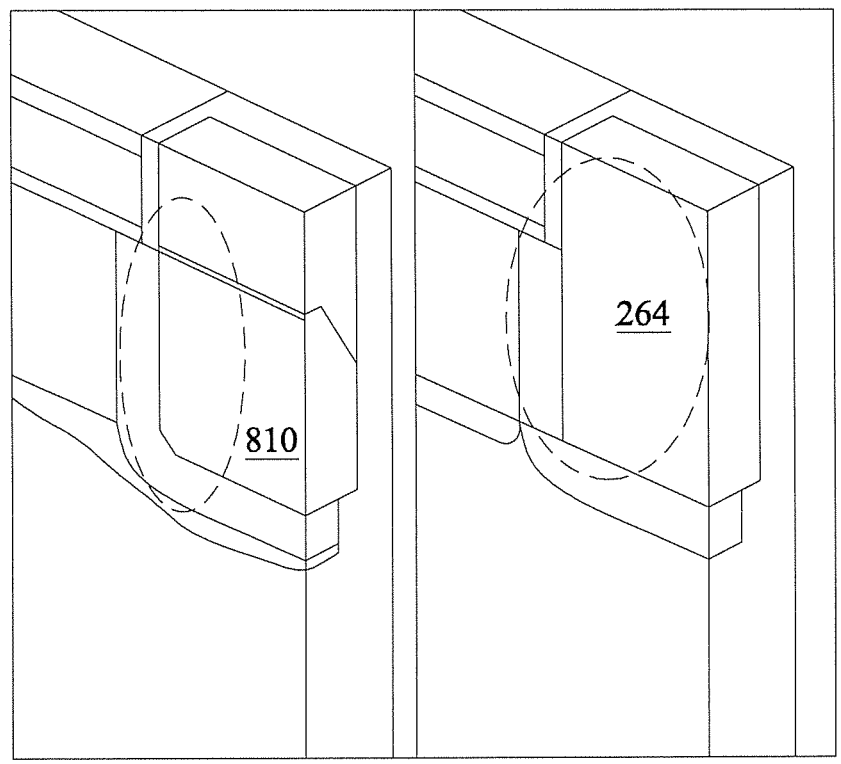

FIGS. 8A and 8B are diagrams showing results of a 3-D simulation of a CAA T-Fin FET device according to an embodiment of the present disclosure. The diagram of FIG. 8A shows series resistance (RT) versus effective channel length for an exemplary Fin FET and a CAA T-Fin FET. The result shows that the contact all around structure has less total resistance (e.g., ~20%) and less source and/or drain resistance (e.g., ~85%) than the exemplary case with the diamond-shape source and/or drain stressor 810. The metal source and/or drain region 264 can enlarge current flow and reduce SD resistance (RSD), because in the CAA T-Fin FET the metal (e.g., 264) replaces highly doped silicon of the diamond shape structure (e.g., 810). The buried oxide (e.g., the self-aligned oxide 232 of FIG. 6) under the source and/or drain contact metals can avoid the junction leakage below the source and drain into the substrate.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a fin structure including a first semiconductor layer, an intermediate semiconductor layer disposed over the first semiconductor layer, and a second semiconductor layer disposed over the intermediate semiconductor layer. An isolation insulating layer is formed so that the second semiconductor layer of the fin structure protrudes from the isolation insulating layer to form an exposed fin portion while the intermediate semiconductor layer and the first semiconductor layer are embedded in the isolation insulating layer. A gate structure is formed over a first portion of the exposed fin portion. A second portion of the exposed fin portion is removed. The second portion includes a portion of the exposed fin portion not covered with the gate structure and an embedded portion including a portion of the intermediate semiconductor layer and the first semiconductor layer. The embedded portion includes a first embedded portion embedded in the isolation insulating layer extending in a first direction and a second embedded portion under the gate structure extending in a second direction. The second direction is substantially perpendicular to the first direction. An oxide layer is formed over first and second surfaces exposed after the removal of the second portion of the exposed fin portion. The first and second surfaces extend in the first and second directions. A portion of the oxide layer extending in the second direction is laterally removed, and an epitaxial layer is formed in the laterally removed portion of the oxide layer.

In accordance with another aspect of the present disclosure, a method for manufacturing a semiconductor device includes forming a fin structure by patterning a multilayer structure comprising a first semiconductor layer including a substrate, a bulk stressor layer, and a second semiconductor layer. An isolation oxide layer is formed to cover the fin structure. The isolation oxide layer is patterned to expose the second semiconductor layer of the fin structure. A gate structure is formed over a middle portion the exposed second semiconductor layer. A remaining portion of the exposed second semiconductor layer not covered with the gate structure is removed. A portion of the bulk stressor layer under the removed remaining portion of the exposed second semiconductor layer and lateral portions under the gate structure are removed. A self-aligned oxide layer covering first and second surfaces exposed after the removal of the portion of the bulk stressor layer and the lateral portions under the gate structure is formed. The first and second surfaces extend in a first and a second direction, and the second direction is substantially perpendicular to the first direction. The self-aligned oxide layer covering the vertical surfaces exposed after removal of the lateral portions under the gate structure is laterally removed, and a source-drain stressor layer is formed to replace the laterally removed self-aligned oxide layer.

In accordance with yet another aspect of the present disclosure, a semiconductor device includes a Fin FET device including a fin structure extending in a first direction and protruding from a substrate layer. The fin structure includes a bulk stressor layer formed on the substrate layer, a channel layer disposed over the bulk stressor layer. An oxide layer is formed on the substrate layer extending away from the channel layer. An SD stressor structure is disposed on sidewalls of the channel layer over the oxide layer, and a gate stack including a gate electrode layer and a gate dielectric layer is formed. The gate stack covers a portion of the channel layer and extends in a second direction perpendicular to the first direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a Fin FET device including:
 a fin structure extending in a first direction and protruding from a substrate layer, the fin structure including a bulk stressor layer formed on the substrate layer, a channel layer disposed over the bulk stressor layer;
 an oxide layer formed on the substrate layer extending away from the channel layer;
 a source-drain stressor structure disposed on sidewalls of the channel layer over the oxide layer; and
 a gate stack including a gate electrode layer and a gate dielectric layer, covering a portion of the channel layer and extending in a second direction perpendicular to the first direction.

2. The semiconductor device of claim 1, further comprising an isolation insulating layer disposed on the substrate layer extending along opposing sides of the fin structure.

3. The semiconductor device of claim 1, wherein the bulk stressor layer comprises an epitaxially formed silicon-germanium (Si—Ge) compound.

4. The semiconductor device of claim 1, wherein the oxide layer comprises a self-aligned oxide layer including silicon oxide.

5. The semiconductor device of claim 1, wherein the source-drain stressor structure comprises a lateral structure and includes epitaxially disposed material including one of a silicon-based compound or a germanium-based compound, wherein the silicon-based compound includes silicon phosphide and SiGe and the germanium-based compound includes a germanium-tin (GeSn) compound.

6. The semiconductor device of claim 1, further comprising source and drain contact metals in contact with the source-drain stressor structure and isolated from the gate stack by a lateral interlayer dielectric structure.

7. The semiconductor device of claim 1, wherein the oxide layer has a thickness between 5 nm and 10 nm.

8. The semiconductor device of claim 1, wherein the bulk stressor layer has a thickness of about 2 nm to about 10 nm.

9. A semiconductor device, comprising:
 a fin structure formed on a substrate, the fin structure extending in a first direction,
 wherein a channel layer is formed in a first region of the fin structure;
 spaced apart oxide layers formed on the substrate extending away from opposing sides of the first region of the fin structure along the first direction;
 a source-drain structure disposed on sidewalls of the channel layer over the oxide layer;
 a gate stack disposed over the first region of the fin structure where the channel layer is formed and extending in a second direction perpendicular to the first direction; and source and drain contact metals in contact with the source-drain structure and isolated from the gate stack by a lateral interlayer dielectric structure.

10. The semiconductor device of claim 9, further comprising an isolation insulating layer disposed on the substrate extending along opposing sides of the fin structure.

11. The semiconductor device of claim 9, further comprising a silicon germanium compound disposed below the channel layer.

12. The semiconductor device of claim 9, wherein the oxide layer is a silicon oxide.

13. The semiconductor device of claim 9, wherein the source-drain structure comprises a lateral structure and includes epitaxially disposed material including one of a silicon-based compound or a germanium-based compound, wherein the silicon-based compound includes silicon phosphide and SiGe and the germanium-based compound includes a germanium-tin (GeSn) compound.

14. The semiconductor device of claim 9, wherein the oxide layer has a thickness between 5 nm and 10 nm.

15. A semiconductor device, comprising:
a fin structure formed on a substrate, the fin structure extending in a first direction,
wherein a bulk stressor layer is formed on the substrate,
wherein a channel layer is disposed over the bulk stressor layer;
an oxide layer formed on the substrate extending away from the channel layer;
a source-drain structure disposed on sidewalls of the channel layer over the oxide layer;
a gate stack disposed over the first region of the fin structure where the channel layer is formed and extending in a second direction perpendicular to the first direction; and
source-drain contacts directly contacting sidewalls of the source-drain structure, wherein the sidewalls of the source-drain structure where the source-drain contacts directly contact the sidewalls of the source-drain structure are parallel to the sidewalls of the channel layer.

16. The semiconductor device of claim 15, further comprising an isolation insulating layer disposed on the substrate layer extending along opposing sides of the fin structure.

17. The semiconductor device of claim 15, wherein the bulk stressor layer comprises an epitaxially formed silicon-germanium (Si—Ge) compound.

18. The semiconductor device of claim 15, wherein the oxide layer comprises a silicon oxide.

19. The semiconductor device of claim 15, wherein the source-drain structure comprises one of a silicon-based compound or a germanium-based compound, wherein the silicon-based compound includes silicon phosphide and SiGe and the germanium-based compound includes a germanium-tin (GeSn) compound.

20. The semiconductor device of claim 15, wherein the source and drain contacts are isolated from the gate stack by a lateral interlayer dielectric structure.

* * * * *